(12) United States Patent
Zhou et al.

(10) Patent No.: US 10,157,822 B1
(45) Date of Patent: Dec. 18, 2018

(54) HETEROGENEOUS INTERCONNECT HAVING LINEAR AND NON-LINEAR CONDUCTIVE PATHWAYS

(71) Applicant: Intel Corporation, Santa Clara, CA (US)

(72) Inventors: Zhen Zhou, Chandler, AZ (US); Tae Young Yang, Chandler, AZ (US); Guosong Lin, Chandler, AZ (US); Ling Zheng, Chandler, AZ (US); Daqiao Du, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/721,691

(22) Filed: Sep. 29, 2017

(51) Int. Cl.
*H01L 23/498* (2006.01)
*H01L 23/60* (2006.01)
*H01L 23/522* (2006.01)

(52) U.S. Cl.
CPC .... *H01L 23/49811* (2013.01); *H01L 23/5226* (2013.01); *H01L 23/60* (2013.01)

(58) Field of Classification Search
CPC ............. H01L 23/498; H01L 23/49811; H01L 23/5226; H01L 23/60
See application file for complete search history.

(56) References Cited

U.S. PATENT DOCUMENTS

| | | | |
|---|---|---|---|
| 7,922,544 B2 | 4/2011 | Chung | |
| 8,841,560 B1* | 9/2014 | Roberts | H05K 1/141 174/261 |
| 9,502,168 B1* | 11/2016 | Ler | H01L 23/64 |
| 2008/0307793 A1* | 12/2008 | Benoit | C04B 37/023 60/752 |
| 2011/0028293 A1* | 2/2011 | Atkin | B01L 3/502707 493/374 |
| 2012/0106052 A1* | 5/2012 | Odineal | G06F 1/183 361/679.02 |
| 2015/0086771 A1* | 3/2015 | Sen | H01B 1/04 428/221 |
| 2017/0187133 A1 | 6/2017 | Sepic et al. | |
| 2017/0194279 A1* | 7/2017 | Uzoh | H01L 24/17 |
| 2017/0215917 A1* | 8/2017 | Harrah | A61B 17/0218 |
| 2017/0246468 A1* | 8/2017 | Kalghatgi | A61N 1/44 |

* cited by examiner

*Primary Examiner* — Phuc Dang
(74) *Attorney, Agent, or Firm* — Patent Capital Group

(57) ABSTRACT

Electrical interconnects having a non-linear conductive pathway, and related apparatuses and methods, are disclosed herein. In some embodiments, an electrical interconnect may include a non-linear conductive pathway electrically coupling top and bottom conductive portions. In some embodiments, an electrical interconnect may include a non-linear conductive pathway that propagates an electrical signal generating electromagnetic fields with an electrical field orthogonal to the direction of electromagnetic-wave propagation. In some embodiments, an electrical interconnect may include a non-linear conductive pathway portion and a linear conductive pathway portion. Also disclosed are connectors including an electrical interconnect having a non-linear conductive pathway. In some embodiments, a connector may include a first electrical interconnect having a non-linear conductive pathway generating first electromagnetic fields; and second electrical interconnect having a linear conductive pathway generating second electromagnetic fields that are orthogonal to the first electromagnetic fields.

19 Claims, 10 Drawing Sheets

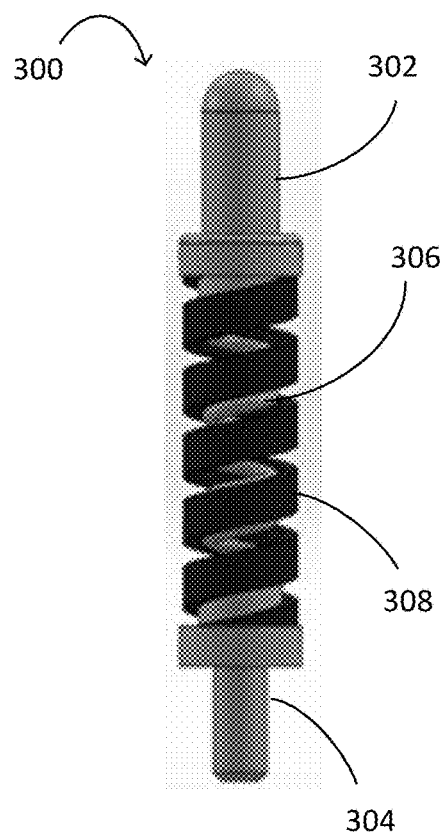
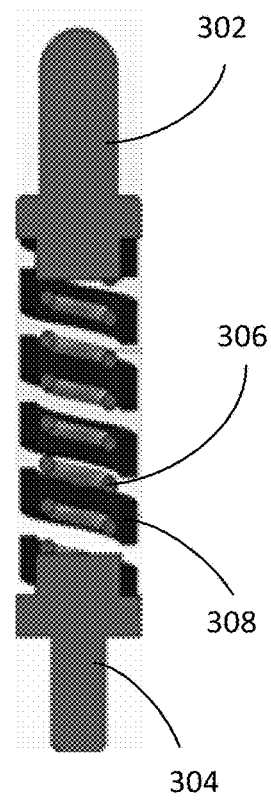
FIG. 3A
FIG. 3B
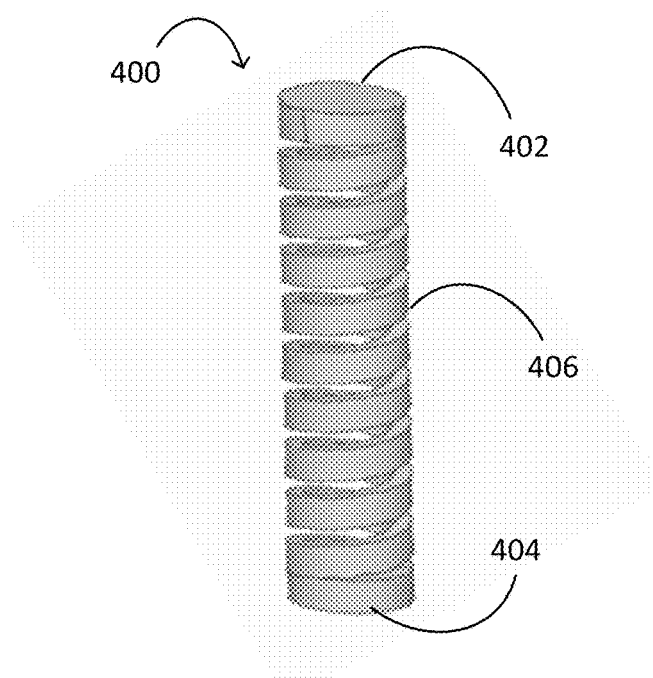
FIG. 4

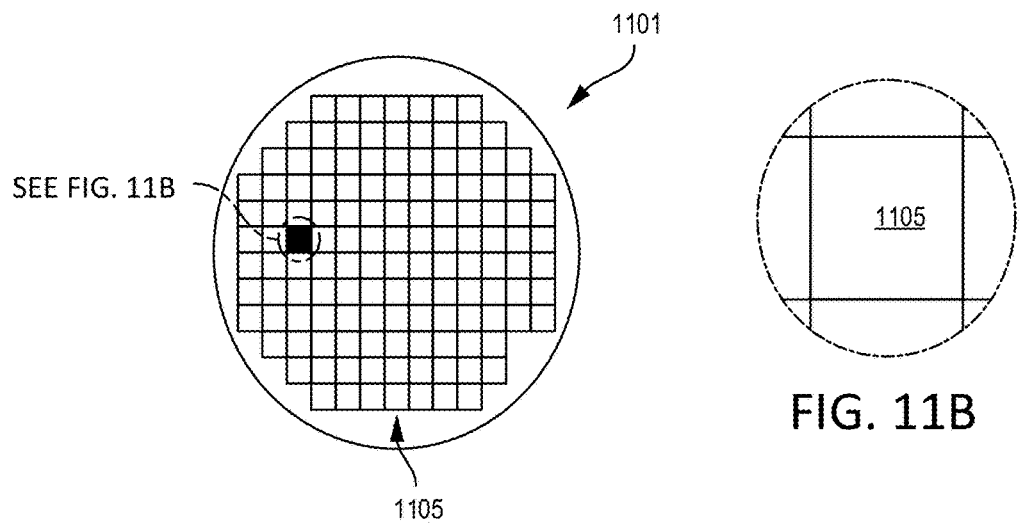
FIG. 11A
FIG. 11B
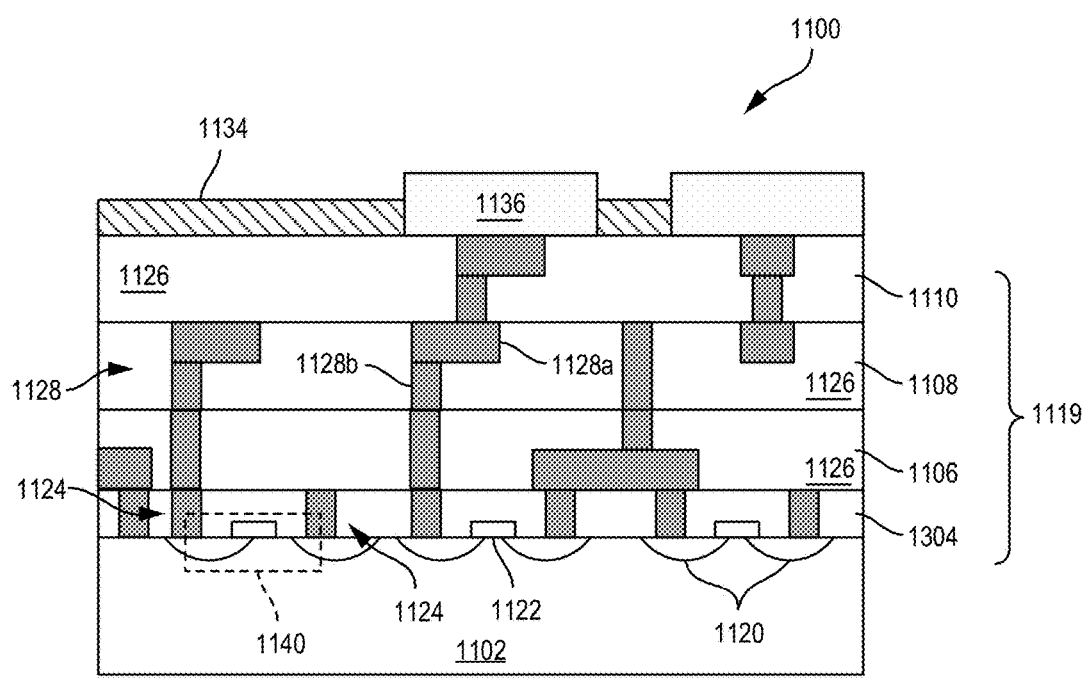
FIG. 11C

HETEROGENEOUS INTERCONNECT HAVING LINEAR AND NON-LINEAR CONDUCTIVE PATHWAYS

BACKGROUND

Integrated circuit (IC) devices are routinely connected to and communicate with other IC devices via a connector having a large number of electrical interconnects that carry high speed signals. The electrical interconnects are in close proximity and commonly experience signal crosstalk and other interference, which degrades the signal integrity and causes an error in the received signal.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 3A-3B are various views of another exemplary interconnect having a non-linear conductive pathway, in accordance with various embodiments.

FIG. 4 is a side view of another exemplary interconnect having a non-linear conductive pathway, in accordance with various embodiments.

FIGS. 11A and 11B are top views of a wafer and dies that may be used with any of the embodiments of the IC packages having a patterned protective layer disclosed herein.

FIG. 11C is a cross-sectional side view of an IC device that may be used with any of the embodiments of the electrical interconnects having a non-linear conductive pathway disclosed herein.

DETAILED DESCRIPTION

Figure 1A:
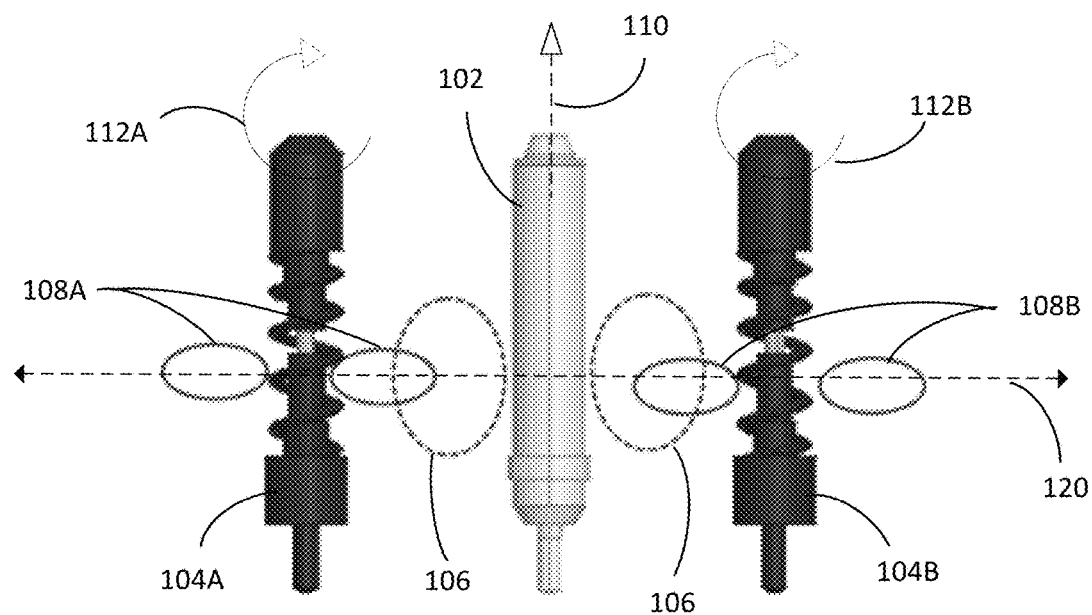
FIG. 1A is a side view of one interconnect having a linear conductive pathway between two interconnects having non-linear conductive pathways illustrating orthogonal electrical fields, in accordance with various embodiments.

Electrical interconnects having a non-linear conductive pathway, as well as related structures, devices, and methods, are disclosed herein. In some embodiments, an electrical interconnect may include: a conductive top portion, a conductive bottom portion, and a non-linear conductive pathway electrically coupling the top portion and the bottom portion. In some embodiments, an electrical interconnect may include: a non-linear conductive pathway where the non-linear conductive pathway is helical. In some embodiments, an electrical interconnect may include: a non-linear conductive pathway where the non-linear conductive pathway is sinusoidal. In some embodiments, an electrical interconnect may include: a non-linear conductive pathway portion, and a linear conductive pathway portion, wherein an electrical signal follows the non-linear and linear conductive pathways. In some embodiments, an electrical interconnect may include: a non-linear conductive pathway; wherein the electrical interconnect propagates an electrical signal such that the electrical signal has electromagnetic fields whose electrical field is orthogonal to a direction of electromagnetic-wave propagation. In some embodiments, an electrical interconnect having a non-linear conductive pathway may be a spring-loaded interconnect. In some embodiments, an electrical interconnect having a non-linear conductive pathway may be a stamped interconnect.

Also disclosed herein are connectors with an electrical interconnect having a non-linear conductive pathway. In some embodiments, a connector may include: a first electrical interconnect having a non-linear conductive pathway, wherein a signal following the non-linear conductive pathway generates first electromagnetic fields; and a second electrical interconnect having a linear conductive pathway, wherein a signal following the linear conductive pathway generates second electromagnetic fields; wherein the second electromagnetic fields are orthogonal to the first electromagnetic fields. In some embodiments, a connector may include a first electrical interconnect having a non-linear conductive pathway; and a second electrical interconnect having a linear conductive pathway, wherein the second electrical interconnect is adjacent to the first electrical interconnect. In some embodiments, a connector with an electrical interconnect having a non-linear conductive pathway may be a temporary manufacturing testing apparatus. In some embodiments, a connector with an electrical interconnect having a non-linear conductive pathway may be a pin grid array (PGA) silicon package or a hybrid PGA and land grid array (LGA) silicon package. In some embodiments, a connector with an electrical interconnect having a non-linear conductive pathway may be a board to board connector.

Also disclosed herein are methods for arranging electrical interconnects having a non-linear conductive pathway and electrical interconnect having a linear conductive pathway in a connector. In some embodiments, a connector may include a plurality of first electrical interconnects having a non-linear conductive pathway; and a plurality of second electrical interconnects having a linear conductive pathway, wherein the plurality of first and second electrical interconnects are arranged in a checkerboard pattern. In some embodiments, a connector may include a plurality of first electrical interconnects having a non-linear conductive pathway; and a plurality of second electrical interconnects having a linear conductive pathway, wherein the plurality of first and second electrical interconnects are arranged symmetrically. In some embodiments, a connector may include an array of first electrical interconnects having a non-linear conductive pathway; and an array of second electrical interconnects having a linear conductive pathway, wherein arrays of first and second electrical interconnects are arranged asymmetrically. As used herein, "a plurality" and "an array" may be used interchangeably.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments. Common elements in different figures may be identified with a common label.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous.

A connector may include a large number of electrically conductive vertical interconnects, such as spring-loaded probes, stamped pins, elastomer pins, etching formed pins, and wired pins, to provide temporary or permanent electrical coupling. An interconnect generally is a conductive element that connects two or more devices electrically for transmitting data, and is typically housed in a connector. Types of connectors may include, for example, silicon package sockets, USB or other devices plugged into a main board, cable, dual in-line memory module (DIMM), Small outline dual inline memory module (SODIMM) connect, and single inlet, among others. In a temporary use case, a connector couples integrated circuitry, such as a microprocessor unit, to other hardware that is to aid in testing of such circuitry during manufacturing. In a permanent use case, a connector couples integrated circuitry of two or more devices, for example, a printed circuit board (PCB) to another PCB, or a die to a silicon package. The electrically conductive vertical interconnects, which are positioned in close proximity in the connector, may cause crosstalk by acting as unintentional and inefficient transmit and receive antennas. Current connector technologies typically use a single type of interconnect architecture for all pins of a connector. Conventional approaches for lessen crosstalk may include reducing pin heights, using shielded pins, increasing the number of ground pins around signal pins, and/or adding an additional capacitive electrical coupling to counteract the magnetic coupling. These conventional approaches are limited, in that, they are frequency-dependent, use the same type of pins, and have the same electromagnetic fields orientation, such that coupling of the electromagnetic fields is likely to occur and cause signal interference. Not only are these conventional approaches costly, but also, may cause mechanical instability and are incompatible with fine pitch packages.

Conventional integrated circuit (IC) devices have been constrained by the use of electrical interconnects having a conductive pathway, which generate electromagnetic fields having the same orientation rather than an orthogonal orientation to transmit data to another IC device. Electrical interconnects (also referred to herein as "interconnects", "vertical interconnects", "interconnect pins", or "pins") in close proximity routinely experience crosstalk due to electric and magnetic field interference among adjacent interconnect pins.

Disclosed herein are interconnects having non-linear conductive pathways (also referred to herein as "H-pins"), which excite electromagnetic fields that are orthogonal to the electromagnetic fields excited by interconnects having linear conductive pathways (also referred to herein as "E-pins"). H-pins may be magnetic-current-driven interconnects, which support a Transverse Electric (TE) mode. In TE mode, the electrical fields are orthogonal to the direction of electromagnetic-wave propagation. E-pins may be electrical-current-driven interconnects, which support a Transverse Magnetic (TM) mode. In TM mode, the magnetic fields are orthogonal to the direction of electromagnetic-wave propagation. The TM and TE modes are orthogonal to each other, such that theoretically, the coupling coefficient between pure TM mode and pure TE mode is zero. As used herein, electromagnetic fields and the direction of electromagnetic fields refer to the dominant mode. Also, the direction of the electromagnetic fields as used herein refers primarily to the far-field zone and not necessarily the near-field zone. An interconnect may excite other field components or other modes in addition to its fundamental mode, however, the fundamental mode will be the dominant mode, even if it is not pure. Although interconnects may be electrically large in a particular frequency range, the coupling mechanism between nearby interconnects is likely to be dominated by the fundamental mode (i.e., TM mode or TE mode). The coupled fields of a plurality of interconnects in close proximity having the same fundamental mode likely to cause signal interference. In contrast, the coupled fields of a plurality of interconnects in close proximity having different fundamental modes (i.e., a combination of TM mode and TE mode) is less likely to cause signal interference due to the orthogonality of the electromagnetic fields. Electromagnetic fields, including directionality, may be measured, for example, by a Near Field Scanner.

Also disclosed herein is a connector having two or more interconnect structures or architecture. For example, a connector may include a first E-pin having a first structure and a second E-pin having a second structure. E-pins may be made of any suitable conductive material or materials, including copper, tin, nickel, aluminum, titanium, stainless steel, beryllium, molybdenum, tungsten, silicon carbide, conductive rubber, metal plated elastomer, and tungsten carbide. E-pins may be fabricated using any suitable manufacturing process, including sheet metal, stamping, and machining. E-pins may have any suitable structure, including, spring-loaded, stamped, buckled, elastomer, etching formed, or wired, among others. In another example, a connector may include a first interconnect having a non-linear conductive pathway (i.e., H-pin) and a second interconnect having a linear conductive pathway (i.e., E-pin). In another example, a connector may include an H-pin having a first structure, such as spring-loaded or stamped, and an E-pin having a second structure, such as spring-loaded, stamped, buckled, elastomer, etching formed, or wired.

FIG. 1A is a side view of one interconnect having a linear conductive pathway positioned between two interconnects having non-linear conductive pathways illustrating orthogonal electrical fields, in accordance with various embodiments. FIG. 1A illustrates E-pin 102 between two H-pins 104A, 104B and the respective electrical fields generated 106, 108A, 108B. E-pin 102 is an electrical-current-driven interconnect having a linear signal path 110 that generates an electrical field 106 along the direction of electromagnetic wave propagation 120. H-pins 104A, 104B are magnetic-current-driven interconnects having non-linear signal paths 112A, 112B that generate electrical fields 108A, 108B orthogonal to the direction of the electromagnetic wave propagation 120

Figure 1B:
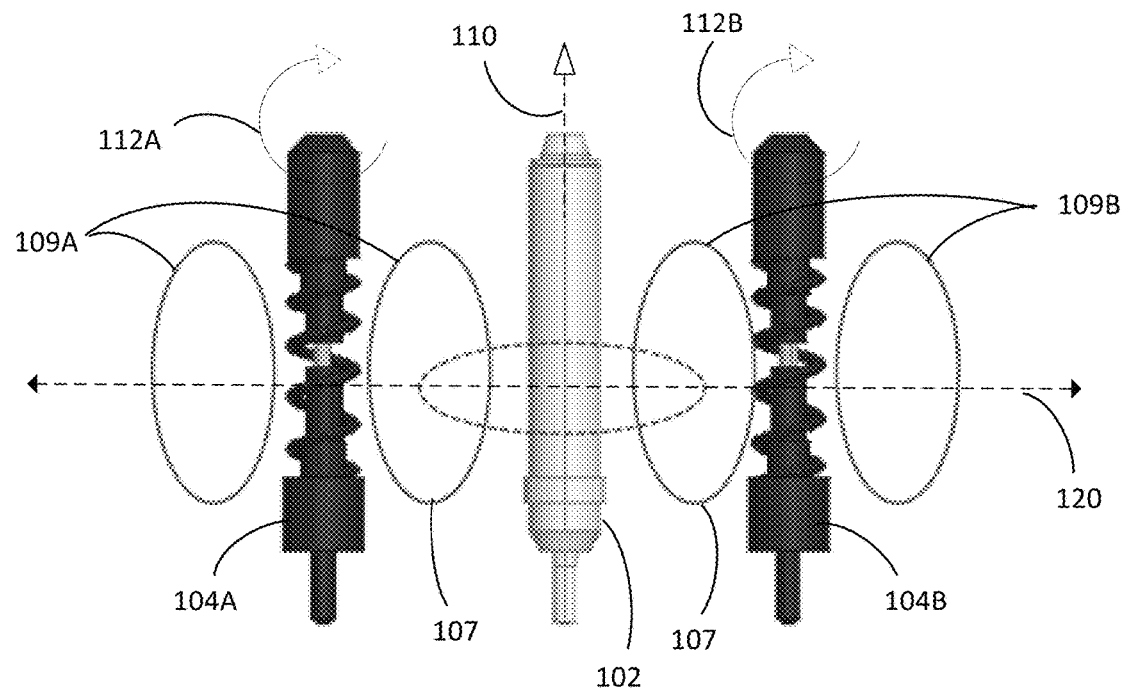
FIG. 1B is a side view of one interconnect having a linear conductive pathway between two interconnects having non-linear conductive pathways illustrating orthogonal magnetic fields, in accordance with various embodiments.

FIG. 1B is a side view of one interconnect having a linear conductive pathway between two interconnects having non-linear conductive pathways illustrating orthogonal magnetic fields, in accordance with various embodiments. FIG. 1B illustrates E-pin 102 between two H-pins 104A, 104B and the respective magnetic fields generated 107, 109A, 109B. E-pin 102 is an electrical-current-driven interconnect having a linear signal path 110 that generates a magnetic field 107 orthogonal to the direction of the electromagnetic wave propagation 120 (i.e., generated magnetic field is circulating orthogonally to the direction of the wave propagation). H-pins 104A, 104B are magnetic-current-driven interconnects having non-linear signal paths 112A, 112B that generate magnetic fields 109A, 109B along the direction of electromagnetic wave propagation 120 (i.e., generated magnetic fields are circulating in the direction of the wave propagation). As shown in FIGS. 1A and 1B, the electromagnetic fields originating from E-pin 102 are orthogonal to the electromagnetic fields originating from H-pins 104A, 104B. The orthogonality of the electromagnetic fields may help to reduce crosstalk as the coupling coefficient of adjacent orthogonal fields may approach zero.

Although FIGS. 1A and 1B depict non-linear signal paths 112A, 112B as circular, the non-linear signal path may be in any non-linear form to generate electromagnetic fields in TE mode, including looped, spiral, helical, sinusoidal, and serpent, among others.

Figure 2A:
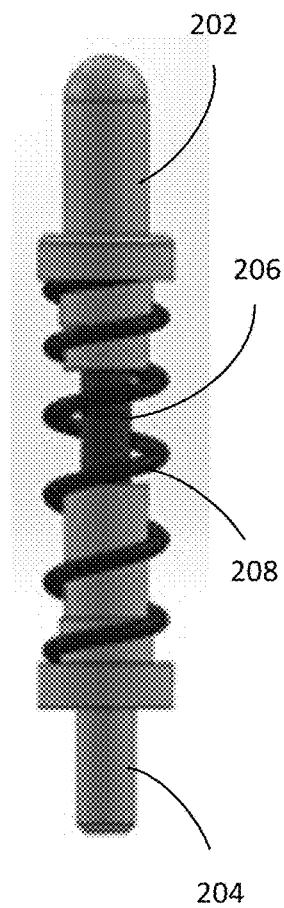
FIGS. 2A-2C are various views of an exemplary interconnect having a non-linear conductive pathway, in accordance with various embodiments.
Figure 2B:
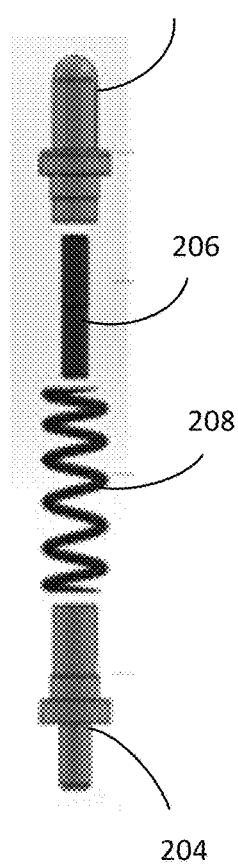
Figure 2C:
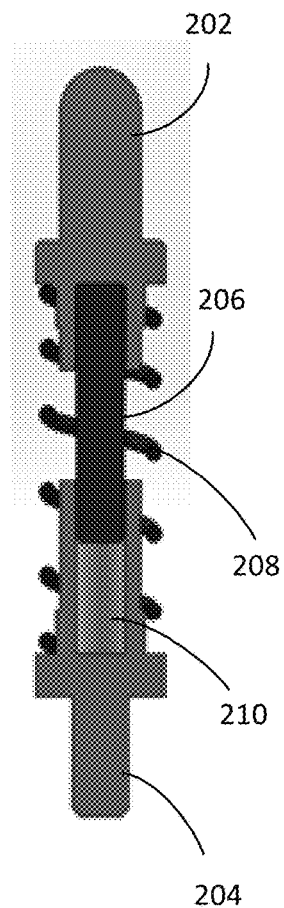

FIGS. 2A-2C are various views of an exemplary interconnect having a non-linear conductive pathway, in accordance with various embodiments. In particular, FIG. 2A is a side view of a spring-loaded interconnect 200 having a non-linear conductive pathway, FIG. 2B is an exploded view of the assembly 200 of FIG. 2A, and FIG. 2C is a side cross-sectional view of the assembly 200 of FIG. 2A. Interconnect assembly 200 may include a top conductive element 202, a bottom conductive element 204, a guide rod 206 to provide a sliding mechanism between the top and bottom elements, and a non-linear conductive pathway 208 electrically coupled to the conductive top element 202 and the conductive bottom element 204. As shown in FIGS. 2A-2C, the non-linear conductive pathway 208 may be a spring or similarly shaped structure.

Interconnect assembly 200 may have any suitable dimensions and may be formed to fit into a connector and may have dimensions to be interchangeable with other types of interconnects. For example, interconnects may have a z-height ranging from 1 millimeter to more than 1 inch depending on the connector and the application. In some embodiments, interconnects may have a z-height ranging from 2 millimeters to 0.5 inches. In some embodiments, interconnects may have a z-height of greater than 2 inches.

FIG. 2B is an exploded view of the assembly 200 of FIG. 2A including a top conductive element 202, a bottom conductive element 204, a guide rod 206, and a non-linear conductive pathway 208. Top and bottom conductive elements 202, 204 may be configured to have any suitable shape and geometry, and may be configured based on the connecting interface, such as cone shaped or crown shaped, for a ball grid array (BGA) or for a land grid array (LGA). Top and bottom conductive elements 202, 204 may be made of any suitable conductive material, including copper, tin, nickel, aluminum, titanium, stainless steel, beryllium, molybdenum, tungsten, silicon carbide, conductive rubber, metal plated elastomer, and tungsten carbide, or a combination of these materials.

Guide rod 206 may be any suitable size and shape to allow for moving top and bottom elements 202, 204 relative to each other. Guide rod 206 may be made of any suitable dielectric material, including one or more of a polymer compound, a poly-resin mold compound, a non-conductive elastomer mold compound, and epoxy.

Non-linear conductive pathway 208 may be any suitable size and dimensions to provide a non-linear conductive pathway and to electrically couple the top and bottom conductive elements. In some embodiments, non-linear conductive pathway 208 may curve or wind in a three-dimensional space to form a helix or a spiral shape. For example, a spiral-shaped non-linear conductive pathway 208 may be constructed to have particular properties, such as matching a targeted impedance, and may be designed to have any suitable shape, including any number of coils, a linear or a tapered structure, any pitch angle, and any diameter. In some embodiments, as shown in FIGS. 2A-2C, non-linear conductive pathway 208 may be a spiral that acts as mechanical spring to provide force under applied loading when the spring is compressed.

In some embodiments, non-linear conductive pathway 208 may curve in a two-dimensional space to form a waveform, such as a sinusoid or serpent.

Non-linear conductive pathway 208 may be made from any suitable conductive material or materials, including copper, tin, nickel, aluminum, titanium, stainless steel, beryllium, molybdenum, tungsten, silicon carbide, conductive rubber, metal plated elastomer, and tungsten carbide, among others. In some embodiments, non-linear conductive pathway 208, a top conductive element 202, and a bottom conductive element 204 may be made from the same conductive material or materials. In some embodiments, non-linear conductive pathway 208 may be made from a different conductive material or materials than top conductive element 202 and/or bottom conductive element 204.

FIG. 2C is a side cross-sectional view of the assembly 200 of FIG. 2A. As shown in FIG. 2C, bottom conductive element 204 may include an opening 210 for receiving guide rod 206 such that, when non-linear conductive pathway 208 is activated or deactivated, top and bottom conductive elements 202, 204 may be compressed together or move apart. Although FIG. 2C shows a particular structure for moving top and bottom elements relative to each other, it may be understood that other mechanical structures may be used.

FIGS. 3A-3B are various views of another exemplary interconnect having a non-linear conductive pathway, in accordance with various embodiments. In particular, FIG. 3A is a side view of another example of a spring-loaded interconnect 300 having a non-linear conductive pathway, and FIG. 3B is a side cross-sectional view of the assembly 300 of FIG. 3A. Interconnect assembly 300 may include a top conductive element 302, a bottom conductive element 304, a coil or spring 306 to provide a mechanism to move top and bottom elements 302, 304 relative to each other, and a non-linear conductive pathway 308 electrically coupled to conductive top element 302 and conductive bottom element 304. As shown in FIG. 3A, non-linear conductive pathway 308 may be a helical barrel or similarly shaped element that surrounds coil 306 and provides a non-linear conductive pathway. Non-linear conductive pathway 308 may be made from any suitable material and may have any suitable dimensions, as described above with reference to FIG. 2. Interconnect assembly 300 may be composed of multiple elements, or may be a single unit incorporating the different elements.

FIG. 3B is a side cross-sectional view of the assembly 300 of FIG. 3A. As shown in FIG. 3B, top and bottom conductive elements 302, 304 may be mechanically connected to coil or spring 306 that may be activated or deactivated to move top and bottom conductive elements 302, 304 together or apart. Coil 306 may be made from any suitable non-conductive or conductive material. Non-conductive materials may include, for example, a polymer compound, a poly-resin mold compound, a non-conductive elastomer mold compound, and an epoxy, or a combination of these materials. Conductive materials may include, for example, copper, tin, nickel, aluminum, titanium, stainless steel, beryllium, molybdenum, tungsten, silicon carbide, conductive rubber, metal plated elastomer, and tungsten carbide, or a combination of these materials. In some embodiments, a conductive coil may be insulated from the non-linear conductive pathway.

FIG. 4 is a side view of another exemplary stamped interconnect 400 having a non-linear conductive pathway, in accordance with various embodiments. Interconnect 400 may have a non-linear conductive pathway 406 and top and bottom conductive elements 402, 404. Interconnect 400 may be formed using any suitable process, including stamping, electroform, or metal fabrication by bending, cutting, or assembling processes. Top and bottom conductive elements 402, 404 may be have any suitable shape and size, and may be formed to optimize a conductive surface contact with a connector. Non-linear conductive pathway 406 may have any suitable size and shape to provide a non-linear signal path, as described above with reference to FIG. 3. In some embodiments, as shown in FIG. 4, non-linear conductive pathway 406 may have a helical shape with a hollow center and a rectangular cross-section. In some embodiments, non-linear conductive pathway 406 may have a spiral shape with a hollow center and a spherical cross-section (not shown)

Figure 5A:
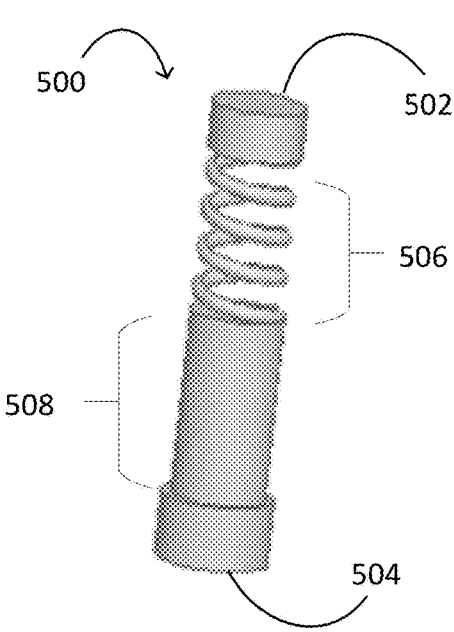
FIGS. 5A-5B are side views of example interconnects having a non-linear conductive pathway portion and a linear conductive pathway portion, in accordance with various embodiments.
Figure 5B:
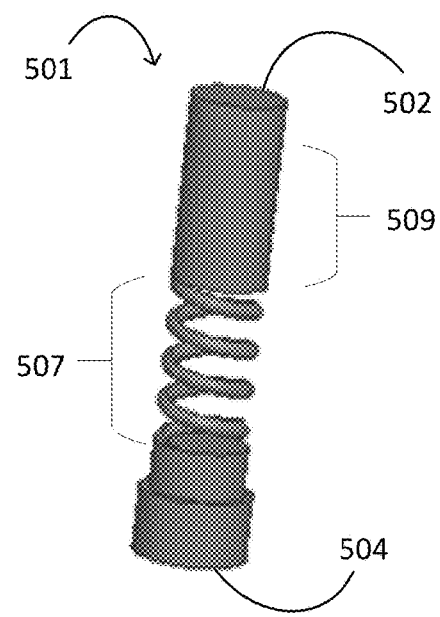

FIGS. 5A-5B are side views of example interconnects 500, 501 having a non-linear conductive portion and a linear conductive portion, in accordance with various embodiments. Interconnects 500, 501 may have a non-linear conductive spiral portion 506, 507, a linear conductive portion 508, 509, and top and bottom conductive elements 502, 504. Non-linear conductive portion may be referred to herein as magnetic-current-driven portion, and linear conductive portion may be referred to herein as electrical-current-driven portion. The non-linear conductive portion generates electromagnetic fields in TE mode while the linear conductive portion generates electromagnetic fields in TM mode, which are orthogonal to the TE mode. As described above, as referred to herein the generated electromagnetic fields refer to the dominantly generated electromagnetic fields. Interconnects having linear and non-linear portions may be referred to herein as "heterogeneous interconnects."

Heterogeneous interconnects 500, 501 may be formed using any suitable process, including stamping, electroform, or metal fabrication by bending, cutting, or assembling processes. Top and bottom conductive elements 502, 504 may have any suitable size and shape, and may be formed to optimize a conductive surface contact with a connector. Linear conductive portion 508, 509 may have any suitable size and shape, including, for example, a tubular shape. In some embodiments, linear conductive portion 508, 509 may have a hollow center or barrel shape. In some embodiments, the diameter may vary along the length of the interconnect 500, 501. Interconnects 500, 501 may be made of any suitable conductive material or materials, including materials as described above with reference to FIG. 2.

Interconnects 500, 501 may be designed and paired, as shown in FIG. 5, where interconnect 500 and interconnect 501 have a non-linear conductive portion 506, 507 adjacent to a linear conductive portion 509, 508, respectively. Heterogeneous interconnect 500 has non-linear portion 506 at the top of the interconnect and linear portion 508 at the bottom of the interconnect. Heterogeneous interconnect 501 has linear portion 509 at the top of the interconnect and non-linear portion 507 at the bottom of the interconnect. When positioned adjacent to each other, interconnect 500 and interconnect 501 have linear portions adjacent to non-linear portions. The alternating linear and non-linear conductive portions in adjacent interconnects 500, 501 may reduce coupling of electromagnetic fields as the electromagnetic fields generated in non-linear portion 506 of interconnect 500 are likely to be orthogonal to the electromagnetic fields generated in linear portion 509 of adjacent interconnect 501. Similarly, the electromagnetic fields generated in linear portion 508 of interconnect 500 are likely to be orthogonal to the electromagnetic fields generated in non-linear portion 507 of adjacent interconnect 501. Although FIG. 5 shows paired interconnects having one non-linear conductive portion and one linear conductive portion, it may be understood that interconnects may have any number of non-linear and linear portions.

Figure 6A:
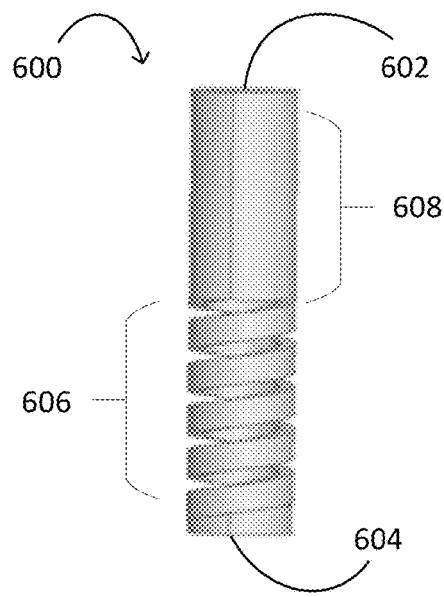
FIGS. 6A-6B are side views of another example of interconnects having a non-linear conductive pathway portion and a linear conductive pathway portion, in accordance with various embodiments.
Figure 6B:
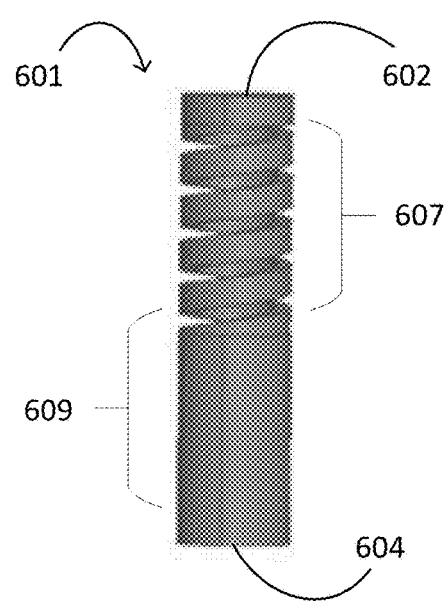

FIGS. 6A-6B are side views of another example of heterogeneous interconnects having a non-linear conductive portion and a linear conductive portion, in accordance with various embodiments. Interconnects 600, 601 may have a non-linear conductive spiral portion 606, 607, a linear conductive portion 608, 609, and top and bottom conductive elements 602, 604. Heterogeneous interconnects 600, 601 may be formed using any suitable process, including stamping, electroform, or metal fabrication by bending, cutting, or assembling processes. Top and bottom conductive elements 602, 604 may have any suitable size and shape, and may be formed to optimize a conductive surface contact with a connector. Linear conductive portion 608, 609 may have any suitable size and shape, including, for example, a tubular shape. In some embodiments, linear conductive portion 608, 609 may have a hollow center or barrel shape. In some embodiments, the diameter may vary along the length of the interconnect 600, 601. Heterogeneous interconnects 600, 601 may be made of any suitable conductive material or materials, including materials described above with reference to FIG. 2.

Heterogeneous interconnects 600,601 may be designed and paired, as shown in FIG. 5, where interconnect 600 and interconnect 601 have a non-linear conductive portion 606, 607 adjacent to a linear conductive portion 609, 608, respectively. Heterogeneous interconnect 600 has non-linear portion 606 at the bottom of the interconnect and linear portion 608 at the top of the interconnect. Heterogeneous interconnect 601 has linear portion 609 at the bottom of the interconnect and non-linear portion 607 at the top of the interconnect. When positioned adjacent to each other, interconnect 600 and interconnect 601 have linear portions adjacent to non-linear portions. The alternating linear and non-linear conductive portions in adjacent interconnects 600, 601 may suppress crosstalk by reducing the coupling of electromagnetic fields as the electromagnetic fields generated in non-linear portion 606 of interconnect 600 are likely to be orthogonal to the electromagnetic fields generated in linear portion 609 of adjacent interconnect 601. Similarly, the electromagnetic fields generated in linear portion 608 of interconnect 600 are likely to be orthogonal to the electromagnetic fields generated in non-linear portion 607 of adjacent interconnect 601. Although FIG. 6 shows paired interconnects having one non-linear conductive portion and one linear conductive portion, it may be understood that interconnects may have any number of non-linear and linear conductive portions.

Figure 7A:
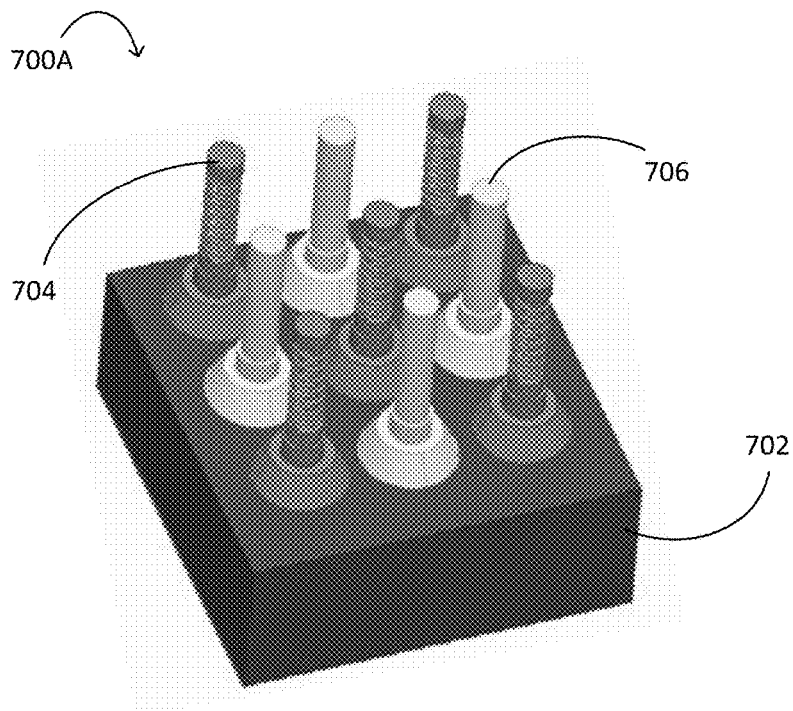
FIGS. 7A-7C are exemplary pin arrays of a pin grid array (PGA) package that include various interconnects having non-linear conductive pathways, in accordance with various embodiments.
Figure 7B:
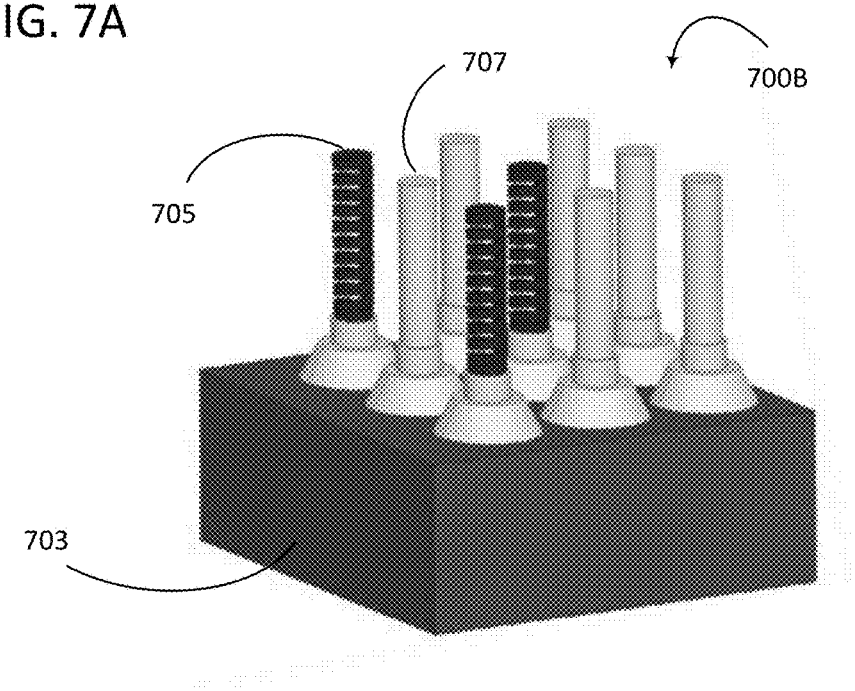
Figure 7C:
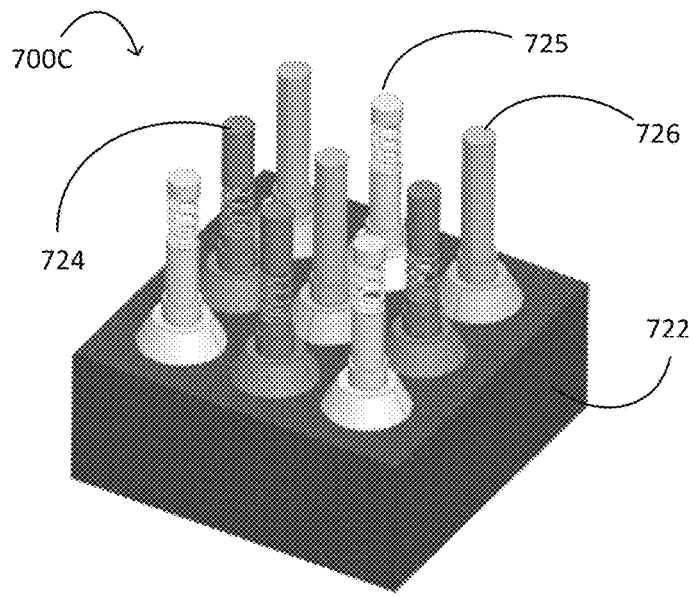

FIGS. 7A-7C are simplified schematics of an exemplary pin grid array (PGA) package that include various interconnects having a non-linear conductive pathway, where the electrical signal follows the non-linear conductive pathway, in accordance with various embodiments. In particular, FIG. 7A is a bottom-to-top view of an exemplary PGA package 700A, also referred to herein as socket assembly, that interconnects having spiral-shaped conductive pathways, FIG. 7B is a side view of an exemplary PGA package 700B that includes stamped interconnects having non-linear conductive pathways, and FIG. 7C is a bottom-to-top view of an exemplary PGA package 700C that includes heterogeneous interconnects having non-linear and linear conductive portions. Interconnects having a non-linear conductive pathway and interconnects having a linear conductive pathway may be arranged to reduce electromagnetic fields coupling and suppress crosstalk.

A socket, which is a type of connector, may include a support structure (referred to herein as a "socket body") and a plurality of pin interconnects extending, at least partially, in the socket body. A socket body may be a single contiguous support structure of a socket or, alternatively, an assembly of multiple constituent bodies, or sub-assemblies. Socket body may be secured by a frame or other support structure to a surface region of an electronic device having conductive contacts for coupling to respective ones of the pin interconnects to allow for signal exchanges. For example, signals may be exchanged via PCB and a connector coupled thereto, or between a connector and test unit to evaluate the functionality of the test unit.

FIG. 7A depicts a checkerboard arrangement in socket body 702 where interconnects having a non-linear conductive pathway 704 alternate with interconnects having a linear conductive pathway 706. FIG. 7B depicts a C-shape arrangement in socket body 703 where Interconnects having a non-linear conductive pathway 705 form a half circle around an interconnect having a linear conductive pathway 707.

FIG. 7C depicts a socket body 722 with homogeneous interconnects 726, which have only a linear conductive pathway, and heterogeneous interconnects 724, 725, which have linear and non-linear conductive pathways. Some heterogeneous interconnects 724 have a non-linear portion on the bottom and a linear portion on the top. Some heterogeneous interconnects 725 have a non-linear portion on the top and a linear portion on the bottom. In FIG. 7C, adjacent heterogeneous interconnects are arranged with alternating non-linear and linear portions. As shown in FIG. 7C, interconnects having only a linear conductive pathway 726 are in a C-shape arrangement. FIGS. 7A-7C show a few exemplary arrangements for interconnects having a non-linear conductive pathway, however, numerous other arrangements may be employed, including symmetrical and asymmetrical arrangements. For example, interconnects having a non-linear conductive pathway and interconnects having a linear conductive pathway may be arranged to alternate based on a determined ratio (e.g., two interconnects having a non-linear conductive pathway for every one interconnect having a linear conductive pathway).

Although FIGS. 7A-7C depict a 3-by-3 array, a connector may have any number of interconnects, for example, the number of interconnects in a connector may range from 3 to more than 3000. A connector may have a "pinout map" that identifies the different connections (e.g., ground, power, signal, and non-connected pins), and interconnect locations. In some embodiments, a connector may have interconnects arranged into signal groups, for example, interconnects for USB signals may be grouped or memory signals may be grouped. It may be understood that any number of interconnects having a non-linear conductive pathway may be used, and may be used in a part of the connector or for a particular signal (i.e., not throughout the entire connector). For example, interconnects having a non-linear conductive pathway may be used for high speed signals, such as for PCIe (Peripheral Component Interconnect Express) signals, and not for low speed control signals. In some embodiments, interconnects having a non-linear conductive pathway may be used for power, ground, or low speed control signals.

Figure 8:
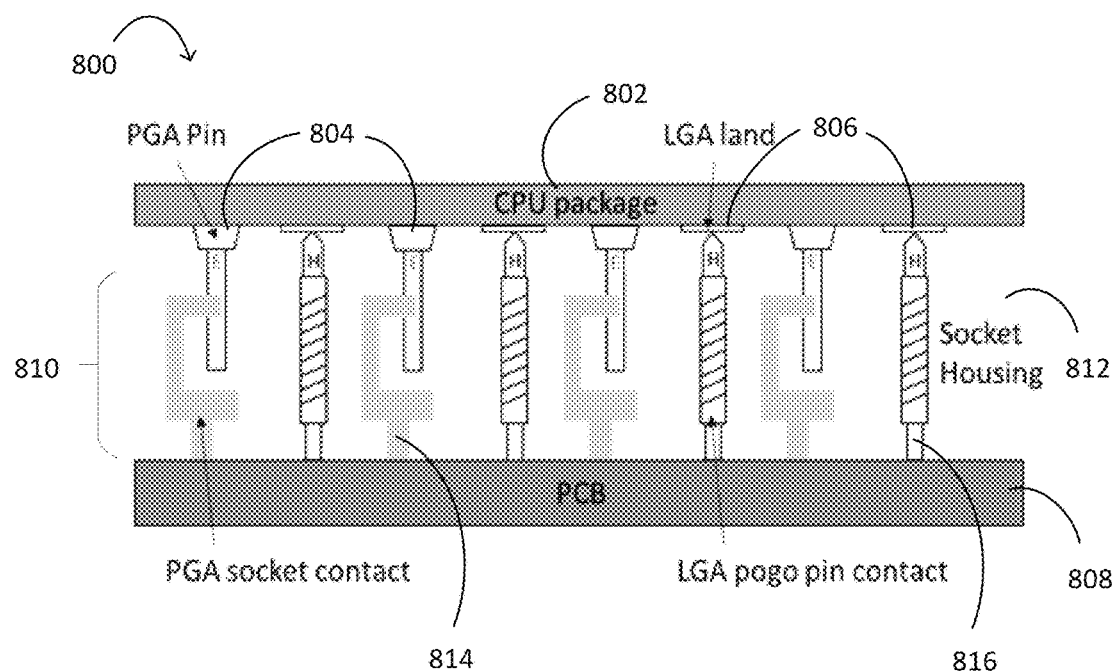
FIG. 8 is an exemplary combination PGA and LGA package that includes interconnects having non-linear conductive pathways, in accordance with various embodiments.

FIG. 8 is an exemplary combination PGA and LGA socket assembly 800 that includes interconnects having non-linear conductive pathways, in accordance with various embodiments. Assembly 800 may include a combination PGA and LGA package 802, a PCB 808, and a socket 810. A die may be packaged in a variety of ways, including a combination PGA and LGA package 802. A PGA has an array of pins or interconnects that serve as the external electrical communication nodes for the package. A LGA has an array of flat contact pads, or lands, that serve as the external electrical communication nodes on the package substrate. A combination PGA and LGA package 802 has both interconnects 804 and lands 806 that serve as the external electrical communication nodes. Socket 810 may include a socket housing 812, a plurality of PGA connectors 814, and a plurality of LGA interconnects 816. In some embodiments, as shown in FIG. 8, PGA interconnects 804 may have linear conductive pathways and LGA interconnects 816 may have non-linear conductive pathways. In some embodiments, the arrangement may be reversed where PGA interconnects may have non-linear conductive pathways and LGA interconnects may have linear conductive pathways. In some embodiments, LGA interconnects 816 having non-linear conductive pathways may be heterogeneous interconnects.

In some embodiments, PGA interconnects 804 having non-linear conductive pathways may be heterogeneous interconnects. In some embodiments, PGA interconnects 804 may be homogeneous interconnects having a non-linear conductive pathway and LGA interconnects 816 may be heterogeneous interconnects having a non-linear conductive portion on the bottom and a linear conductive portion on the top, such that the PGA non-linear conductive pathway and the LGA linear conductive portion alternate in the area (i.e., within the z-height area) where the interconnects overlap. In some embodiments, PGA interconnects 804 and LGA interconnects 816 may be heterogeneous interconnects, and may be arranged to alternate adjacent linear and non-linear conductive portions.

Figure 9A:
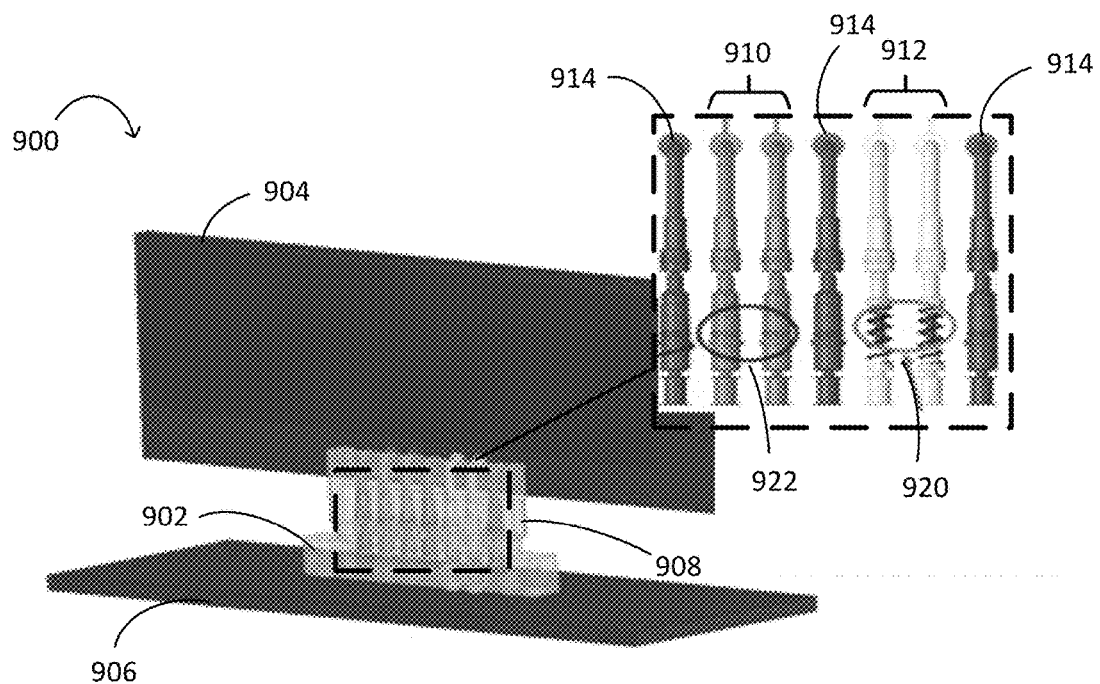
FIGS. 9A-9B are exemplary board to board connectors with interconnects having non-linear conductive pathways, in accordance with various embodiments.
Figure 9B:
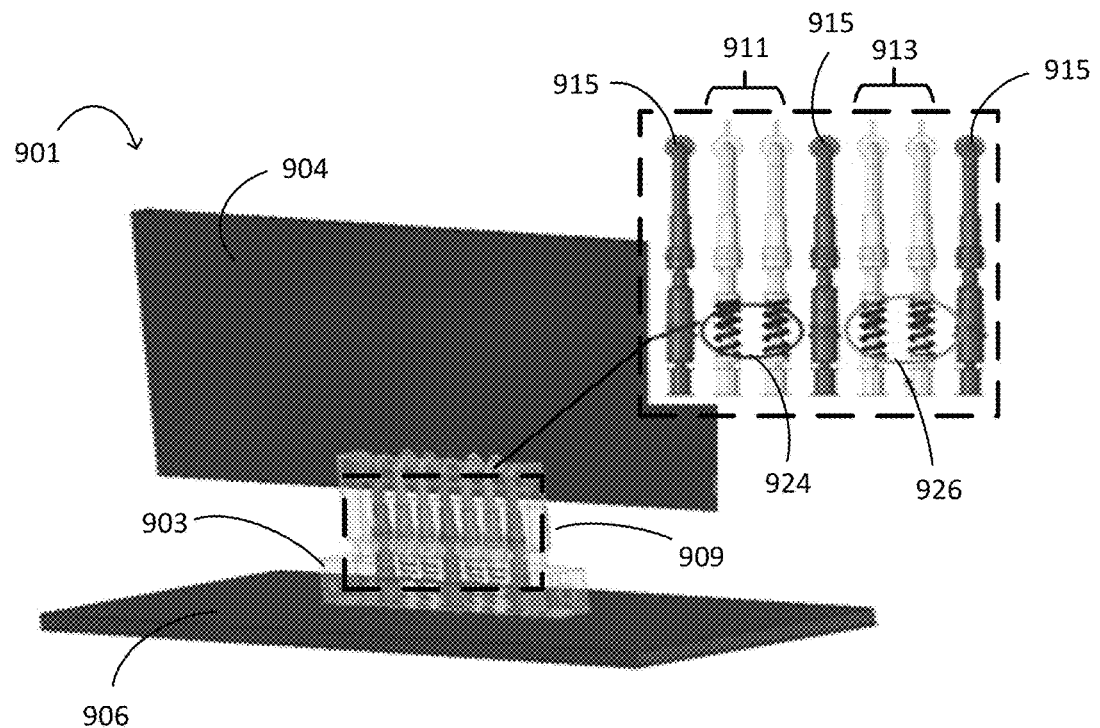

FIGS. 9A-9B illustrate exemplary board to board connectors having interconnects with a non-linear conductive pathway, in accordance with various embodiments. In particular, FIG. 9A is an exemplary board-to-board connector with asymmetrically paired interconnects, where one pair of interconnects have non-linear conductive pathways, and FIG. 9B is an exemplary board to board connector with symmetrically paired interconnects, where both pairs of interconnects have non-linear conductive pathways. In FIG. 9A, assembly 900 may include board-to-board connector 902, for example, a PCB-to-PCB connector, connecting display 904 to PCB 906, or, in another example, connecting a motherboard 906 to a daughter card 904, or in another example, connecting a motherboard 906 to PCB 904, where a USB device is mounted. Interconnects 908 (indicated by dotted line) on board-to-board connector 902 are magnified. Interconnects 908 may include three ground signal interconnects 914, a differential pair of transmitter signal interconnects 910, and a differential pair of receiver signal interconnects 912. As shown in FIG. 9A, the differential pair of transmitter interconnects 910 have linear conductive pathways 922, and the adjacent differential pair of receiver interconnects 912 have non-linear conductive pathways 920.

In FIG. 9B, assembly 901 may include board-to-board connector 903, for example, a PCB-to-PCB connector, connecting display 904 to PCB 906. Interconnects 909 (indicated by dotted line) on board-to-board connector 903 are magnified. Interconnects 909 may include three ground signal interconnects 915, a differential pair of transmitter signal interconnects 911, and a differential pair of receiver signal interconnects 913. As shown in FIG. 9B, both the differential pair of transmitter interconnects 911 and the adjacent differential pair of receiver interconnects 913 have non-linear conductive pathways 924, 926.

Although FIGS. 9A-9B illustrate two differential pairs of interconnects, board-to-board connector 902, 903 may have any number of differential pairs, may have a combination of differential pairs and single-ended interconnects, and interconnects having non-linear conductive pathways may be arranged symmetrically or asymmetrically on the board-to-board connector.

Figure 10A:
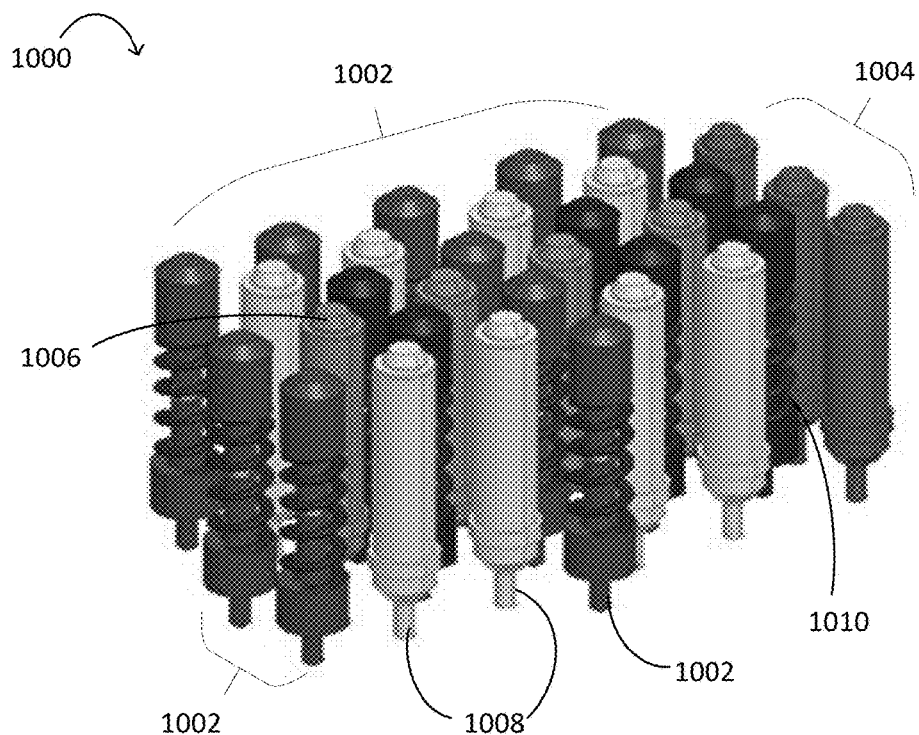
FIGS. 10A-10B are various views of an exemplary manufacturing testing socket that includes various interconnects having non-linear conductive pathways, in accordance with various embodiments.
Figure 10B:
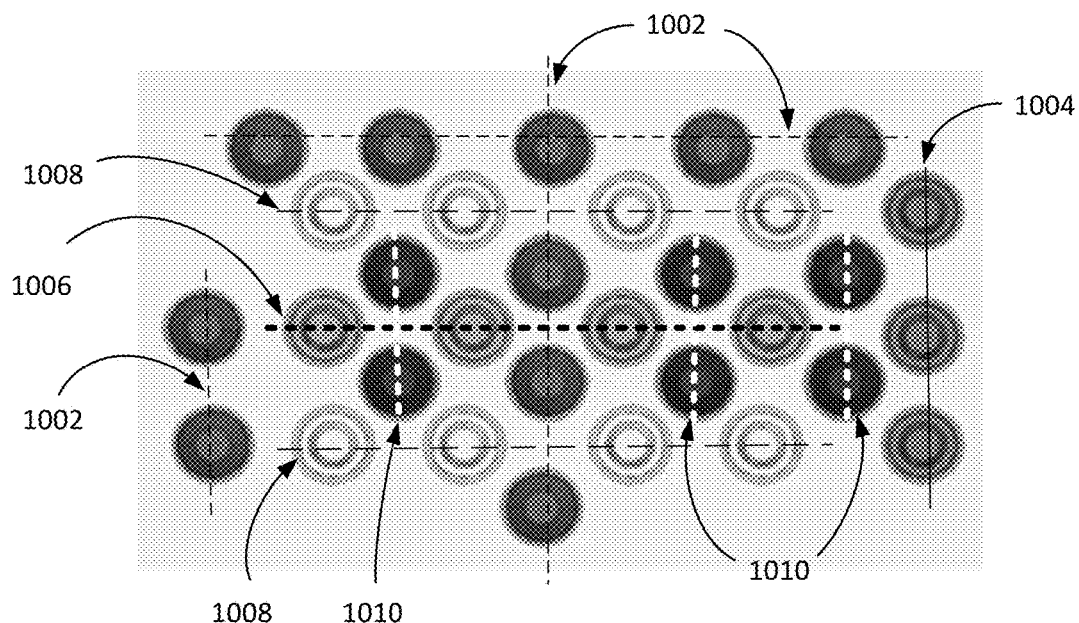

FIGS. 10A-10B are various views of an exemplary manufacturing testing socket arrangement that includes various interconnects having non-linear conductive pathways, in accordance with various embodiments. In particular, FIG. 10A is a side-to-top view of an exemplary manufacturing testing socket arrangement for testing double data rate random access memory (DDR) that includes various interconnects having non-linear conductive pathways, and FIG. 10B is a top view of the assembly of FIG. 10A. The asymmetrical DDR interconnect pattern 1000 for the testing socket (not shown) includes five types of interconnects: H-pin ground interconnects 1002, E-pin power interconnects 1004, differential pair interconnects 1006, E-pin signal interconnects 1008, and H-pin signal interconnects 1010. As shown in FIG. 10B, H-pin ground interconnects 1002 are arranged in a T-formation along the top and middle with two additional pins in a vertical line on the left side, three E-pin power interconnects 1004 are arranged in a vertical line on the right side, four differential pair interconnects 1006 are arranged in a horizontal line in the middle, two horizontal lines of four E-pin signal interconnects 1008 are arranged above and below the line of differential pair interconnects 1006, and three vertical lines of two H-pin signal interconnects 1010 are arranged in between the other interconnects. Asymmetrical interconnect arrangement 1000 is exemplary arrangement for cross talk suppression and reflection reduction, however, numerous other arrangements may be employed, including a symmetrical pattern. In some embodiments, as depicted in FIG. 10, H-pins may be employed for ground and signal connections. In some embodiments, H-pins may be employed for signal connections only. In some embodiments, H-pins may be employed for ground, signal, and power connections. In some embodiments, H-pins may be heterogeneous interconnects having linear and non-linear conductive pathway portions. In some embodiments, E-pins may be any cylindrical shape and may have any architecture or structure, for example, spring-loaded, stamped, buckled, elastomer, etching formed, or wired, among others.

FIGS. 10A-10B depict an exemplary manufacturing testing socket arrangement. Testing a semiconductor die, or other integrated circuit device, during manufacturing involves establishing an electrical connection between testing equipment, such as a test board, and the circuitry of a die or an IC device. Testing may be performed on an unpackaged die that has been singulated from a semiconductor-wafer, on a section of dice that are still part of the wafer, or on all of the dice on a wafer. Testing may also be performed on a bare die that has undergone packaging steps, such as a flip chip. The device to be tested will hereinafter be referred to as a device under test (DUT), regardless of the singulation or packaging state of the die. Returning to the testing process, the PCB with the connected socket is placed in a chamber, wherein the DUTs are tested while subjected to an elevated temperature. Such testing is referred to as burn-in testing. The socket's contacts provide electrical communication between the DUT and signals sent through the PCB from the test equipment. Once the test is complete, the DUT is removed from the socket. DUTs which do not pass the testing are discarded, and DUTs that pass may undergo further testing and ultimately be used as components in electronic devices.

Various embodiments are described herein with a particular reference to a manufacturing testing socket assembly to couple a DUT to hardware that is to run a test of the DUT, or to a socket assembly coupled to PCB. However, such descriptions may be extended to additionally or alternatively apply to any of a variety of other applications wherein a socket assembly is to couple to an IC device. The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, netbook computers, notebook computers, internet devices, payment terminals, personal digital assistants, media players and/or recorders, servers, set-top boxes, smart phones, tablet personal computers, ultra-mobile personal computers, wired telephones, combinations thereof, and the like. Such devices may be portable or stationary. More generally, the technologies described herein may be employed in any of a variety of electronic devices including a socket to couple an integrated circuit device (e.g., an IC chip or a packaged device) to a substrate of a PCB or other such device.

FIGS. 11A-B are top views of a wafer 1101 and dies 1105 that may be included in an IC assembly that is electrically coupled to a connector having interconnects with a non-linear conductive pathway as disclosed herein. The wafer 1101 may be composed of semiconductor material and may include one or more dies 1105 having IC elements formed on a surface of the wafer 1101. Each of the dies 1105 may be a repeating unit of a semiconductor product that includes any suitable IC. After the fabrication of the semiconductor product is complete, the wafer 1101 may undergo a singulation process in which each of the dies 1105 is separated from one another to provide discrete "chips" of the semiconductor product. The die 1105 may include one or more transistors (e.g., some of the transistors 1140 of FIG. 11C, discussed below) and/or supporting circuitry to route electrical signals to the transistors, as well as any other IC components. In some embodiments, the wafer 1101 or the die 1105 may include a memory device (e.g., a static random access memory (SRAM) device), a logic device (e.g., AND, OR, NAND, or NOR gate), or any other suitable circuit element. Multiple ones of these devices may be combined on a single die 1105. For example, a memory array formed by multiple memory devices may be formed on a same die 1105 as a processing device (e.g., the processing device 1202 of FIG. 12) or other logic that is configured to store information in the memory devices or execute instructions stored in the memory array. In some embodiments, the die 1105 may include circuitry that is to couple to and interact with circuitry provided by integral devices in the package substrate, after the die 1105 is coupled to the package substrate, as discussed above.

FIG. 11C is a cross-sectional side view of an IC device 1100 that may be included in a die that may be coupled to a package substrate. In particular, one or more of the IC devices 1100 may be included in one or more dies. The IC device 1100 may be formed on a substrate 1102 (e.g., the wafer 1101 of FIG. 11A) and may be included in a die (e.g., the die 1105 of FIG. 11B). The substrate 1102 may be a semiconductor substrate composed of semiconductor material systems including, for example, N-type or P-type materials systems. The substrate 1102 may include, for example, a crystalline substrate formed using a bulk silicon or a silicon-on-insulator substructure. In some embodiments, the substrate 1102 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1102. Although a few examples of materials from which the substrate 1102 may be formed are described here, any material that may serve as a foundation for an IC device 1100 may be used. The substrate 1102 may be part of a singulated die (e.g., the dies 1105 of FIG. 11B) or a wafer (e.g., the wafer 1101 of FIG. 11A).

The IC device 1100 may include one or more device layers 1104 disposed on the substrate 1102. The device layer 1104 may include features of one or more transistors 1140 (e.g., metal oxide semiconductor field-effect transistors (MOSFETs)) formed on the substrate 1102. The device layer 1104 may include, for example, one or more source and/or drain (S/D) regions 1120, a gate 1122 to control current flow in the transistors 1140 between the S/D regions 1120, and one or more S/D contacts 1124 to route electrical signals to/from the S/D regions 1120. The transistors 1140 may include additional features not depicted for the sake of clarity, such as device isolation regions, gate contacts, and the like. The transistors 1140 are not limited to the type and configuration depicted in FIG. 11C and may include a wide variety of other types and configurations such as, for example, planar transistors, nonplanar transistors, or a combination of both. Nonplanar transistors may include FinFET transistors, such as double-gate transistors or tri-gate transistors, and wraparound or all-around gate transistors, such as nanoribbon and nanowire transistors.

Each transistor 1140 may include a gate 1122 formed of at least two layers, a gate dielectric layer and a gate electrode layer. The gate dielectric layer may include one layer or a stack of layers. The one or more layers may include silicon oxide, silicon dioxide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer may be formed on the gate dielectric layer and may include at least one P-type work-function metal or N-type work-function metal, depending on whether the transistor 1140 is to be a PMOS or an NMOS transistor. In some implementations, the gate electrode layer may consist of a stack of two or more metal layers, where one or more metal layers are work-function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides (e.g., ruthenium oxide). For an NMOS transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide).

In some embodiments, when viewed as a cross section of the transistor 1140 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1120 may be formed within the substrate 1102 adjacent to the gate 1122 of each transistor 1140. The S/D regions 1120 may be formed using either an implantation/diffusion process or an etching/deposition process, for example. In the former process, dopants such as boron, aluminum, antimony, phosphorous, or arsenic may be ion-implanted into the substrate 1102 to form the S/D regions 1120. An annealing process that activates the dopants and causes them to diffuse farther into the substrate 1102 may follow the ion-implantation process. In the latter process, the substrate 1102 may first be etched to form recesses at the locations of the S/D regions 1120. An epitaxial deposition process may then be carried out to fill the recesses with material that is used to fabricate the S/D regions 1120. In some implementations, the S/D regions 1120 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1120 may be formed using one or more alternate semiconductor materials such as germanium or a group III-V material or alloy. In further embodiments, one or more layers of metal and/or metal alloys may be used to form the S/D regions 1120.

Electrical signals, such as power and/or input/output (I/O) signals, may be routed to and/or from the transistors 1140 of the device layer 1104 through one or more interconnect layers disposed on the device layer 1104 (illustrated in FIG. 11C as interconnect layers 1106-1110). For example, electrically conductive features of the device layer 1104 (e.g., the gate 1122 and the S/D contacts 1124) may be electrically coupled with the interconnect structures 1128 of the interconnect layers 1106-1110. The one or more interconnect layers 1106-1110 may form an interlayer dielectric (ILD) stack 1119 of the IC device 1100.

The interconnect structures 1128 may be arranged within the interconnect layers 1106-1110 to route electrical signals according to a wide variety of designs (in particular, the arrangement is not limited to the particular configuration of interconnect structures 1128 depicted in FIG. 11C). Although a particular number of interconnect layers 1106-1110 is depicted in FIG. 11C, embodiments of the present disclosure include IC devices having more or fewer interconnect layers than depicted.

In some embodiments, the interconnect structures 1128 may include trench structures 1128a (sometimes referred to as "lines") and/or via structures 1128b (sometimes referred to as "holes") filled with an electrically conductive material such as a metal. The trench structures 1128a may be arranged to route electrical signals in a direction of a plane that is substantially parallel with a surface of the substrate 1102 upon which the device layer 1104 is formed. For example, the trench structures 1128a may route electrical signals in a direction in and out of the page from the perspective of FIG. 11C. The via structures 1128b may be arranged to route electrical signals in a direction of a plane that is substantially perpendicular to the surface of the substrate 1102 upon which the device layer 1104 is formed. In some embodiments, the via structures 1128b may electrically couple trench structures 1128a of different interconnect layers 1106-1110 together.

The interconnect layers 1106-1110 may include a dielectric material 1126 disposed between the interconnect structures 1128, as shown in FIG. 11C. In some embodiments, the dielectric material 1126 disposed between the interconnect structures 1128 in different ones of the interconnect layers 1106-1110 may have different compositions; in other embodiments, the composition of the dielectric material 1126 between different interconnect layers 1106-1110 may be the same.

A first interconnect layer 1106 (referred to as Metal 1 or "M1") may be formed directly on the device layer 1104. In some embodiments, the first interconnect layer 1106 may include trench structures 1128a and/or via structures 1128b, as shown. The trench structures 1128a of the first interconnect layer 1106 may be coupled with contacts (e.g., the S/D contacts 1124) of the device layer 1104.

A second interconnect layer 1108 (referred to as Metal 2 or "M2") may be formed directly on the first interconnect layer 1106. In some embodiments, the second interconnect layer 1108 may include via structures 1128b to couple the trench structures 1128a of the second interconnect layer 1108 with the trench structures 1128a of the first interconnect layer 1106. Although the trench structures 1128a and the via structures 1128b are structurally delineated with a line within each interconnect layer (e.g., within the second interconnect layer 1108) for the sake of clarity, the trench structures 1128a and the via structures 1128b may be structurally and/or materially contiguous (e.g., simultaneously filled during a dual-damascene process) in some embodiments.

A third interconnect layer 1110 (referred to as Metal 3 or "M3") (and additional interconnect layers, as desired) may be formed in succession on the second interconnect layer 1108 according to similar techniques and configurations described in connection with the second interconnect layer 1108 or the first interconnect layer 1106.

The IC device 1100 may include a solder resist material 1134 (e.g., polyimide or similar material) and one or more bond pads 1136 formed on the interconnect layers 1106-1110. The bond pads 1136 may provide the contacts to couple to first level interconnects, for example. The bond pads 1136 may be electrically coupled with the interconnect structures 1128 and configured to route the electrical signals of the transistor(s) 1140 to other external devices. For example, solder bonds may be formed on the one or more bond pads 1136 to mechanically and/or electrically couple a chip including the IC device 1100 with another component (e.g., a circuit board). The IC device 1100 may have other alternative configurations to route the electrical signals from the interconnect layers 1106-1110 than depicted in other embodiments. For example, the bond pads 1136 may be replaced by or may further include other analogous features (e.g., posts) that route the electrical signals to external components.

Figure 12:
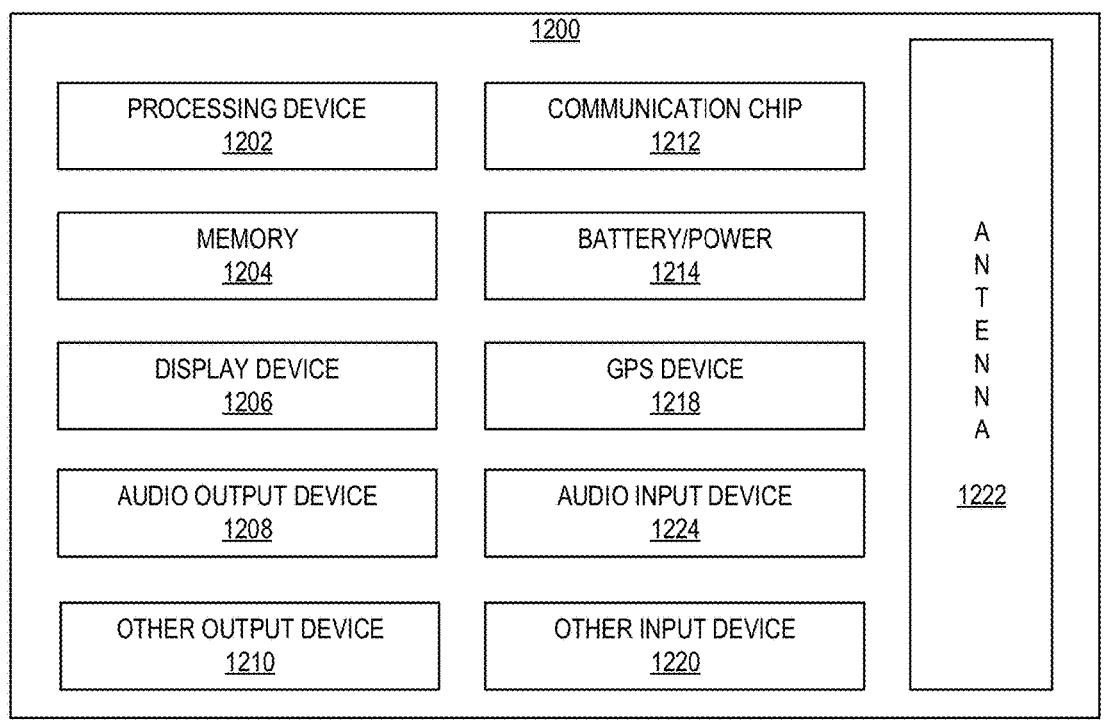
FIG. 12 is a block diagram of an example computing device that may include any of the embodiments of the electrical interconnects having a non-linear conductive pathway disclosed herein.

FIG. 12 is a block diagram of an example computing device 1200 that may include a connector having interconnects with a non-linear conductive pathway disclosed herein. For example, any suitable ones of the components of the computing device 1200 may include, or be included in, an IC assembly including a die having direct diagonal connections, in accordance with any of the embodiments disclosed herein. A number of components are illustrated in FIG. 12 as included in the computing device 1200, but any one or more of these components may be omitted or duplicated, as suitable for the application. In some embodiments, some or all of the components included in the computing device 1200 may be attached to one or more motherboards. In some embodiments, some or all of these components are fabricated onto a single system-on-a-chip (SoC) die.

Additionally, in various embodiments, the computing device 1200 may include interface circuitry for coupling to the one or more components. For example, the computing device 1200 may not include a display device 1206, but may include display device interface circuitry (e.g., a connector and driver circuitry) to which a display device 1206 may be coupled. In another set of examples, the computing device 1200 may not include an audio input device 1224 or an audio output device 1208, but may include audio input or output device interface circuitry (e.g., connectors and supporting circuitry) to which an audio input device 1224 or audio output device 1208 may be coupled.

The computing device 1200 may include a processing device 1202 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1202 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 1200 may include a memory 1204, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1204 may include memory that shares a die with the processing device 1202. This memory may be used as cache memory and may include embedded dynamic random access memory (eDRAM) or spin transfer torque magnetic random-access memory (STT-MRAM).

In some embodiments, the computing device 1200 may include a communication chip 1212 (e.g., one or more communication chips). For example, the communication chip 1212 may be configured for managing wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1212 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1212 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1212 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1212 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1212 may operate in accordance with other wireless protocols in other embodiments. The computing device 1200 may include an antenna 1222 to facilitate wireless communications and/or to receive other wireless communications (such as AM or FM radio transmissions).

In some embodiments, the communication chip 1212 may manage wired communications, such as electrical, optical, or any other suitable communication protocols (e.g., the Ethernet). As noted above, the communication chip 1212 may include multiple communication chips. For instance, a first communication chip 1212 may be dedicated to shorter-range wireless communications such as Wi-Fi or Bluetooth, and a second communication chip 1212 may be dedicated to longer-range wireless communications such as GPS, EDGE, GPRS, CDMA, WiMAX, LTE, EV-DO, or others. In some embodiments, a first communication chip 1212 may be dedicated to wireless communications, and a second communication chip 1212 may be dedicated to wired communications.

The computing device 1200 may include battery/power circuitry 1214. The battery/power circuitry 1214 may include one or more energy storage devices (e.g., batteries or capacitors) and/or circuitry for coupling components of the computing device 1200 to an energy source separate from the computing device 1200 (e.g., AC line power).

The computing device 1200 may include a display device 1206 (or corresponding interface circuitry, as discussed above). The display device 1206 may include any visual indicators, such as a heads-up display, a computer monitor, a projector, a touchscreen display, a liquid crystal display (LCD), a light-emitting diode display, or a flat panel display, for example.

The computing device 1200 may include an audio output device 1208 (or corresponding interface circuitry, as discussed above). The audio output device 1208 may include any device that generates an audible indicator, such as speakers, headsets, or earbuds, for example.

The computing device 1200 may include an audio input device 1224 (or corresponding interface circuitry, as discussed above). The audio input device 1224 may include any device that generates a signal representative of a sound, such as microphones, microphone arrays, or digital instruments (e.g., instruments having a musical instrument digital interface (MIDI) output).

The computing device 1200 may include a global positioning system (GPS) device 1218 (or corresponding interface circuitry, as discussed above). The GPS device 1218 may be in communication with a satellite-based system and may receive a location of the computing device 1200, as known in the art.

The computing device 1200 may include an other output device 1210 (or corresponding interface circuitry, as discussed above). Examples of the other output device 1210 may include an audio codec, a video codec, a printer, a wired or wireless transmitter for providing information to other devices, or an additional storage device.

The computing device 1200 may include an other input device 1220 (or corresponding interface circuitry, as discussed above). Examples of the other input device 1220 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1200 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1200 may be any other electronic device that processes data.

The following examples pertain to further embodiments. The various features of the different embodiments may be variously combined with some features included and others excluded to suit a variety of different applications.

Example 1 is an electrical interconnect including: a top conductive element; a bottom conductive element; and a conductive pathway electrically coupling the top and bottom elements, wherein the conductive pathway includes a non-linear conductive pathway.

Example 2 may include the subject matter of Example 1, and may further specify that the non-linear conductive pathway is helical.

Example 3 may include the subject matter of Example 1, and may further specify that the non-linear conductive pathway is sinusoidal.

Example 4 may include the subject matter of any of Examples 1-3, and may further specify that the non-linear conductive pathway comprises one or more of copper, tin, nickel, aluminum, titanium, stainless steel, beryllium, molybdenum, tungsten, silicon carbide, conductive rubber, metal plated elastomer, and tungsten carbide.

Example 5 may include the subject matter of any of Examples 1-4, and may further specify that the electrical interconnect is a spring-loaded interconnect.

Example 6 may include the subject matter of any of Examples 1-4, and may further specify that the electrical interconnect is a stamped interconnect.

Example 7 may include the subject matter of any of Examples 1-6, and may further specify that the electrical interconnect is to propagate an electrical signal such that the electrical signal has electromagnetic fields whose electrical field is orthogonal to an electromagnetic field wave propagation direction.

Example 8 may include the subject matter of Example 1, and may further specify that the conductive pathway further includes: a linear conductive pathway, wherein the linear conductive pathway is in a first portion of the conductive pathway, and wherein the non-linear conductive pathway is in a second portion of the conductive pathway.

Example 9 is a connector, including: a body; and an electrical interconnect extending into the body, including: a top conductive element; a bottom conductive element; and a conductive pathway electrically coupling the top and bottom elements, wherein the conductive pathway is a non-linear conductive pathway.

Example 10 may include the subject matter of Example 9, and may further specify that the non-linear conductive pathway is helical.

Example 11 may include the subject matter of Example 9, and may further specify that the non-linear conductive pathway is sinusoidal.

Example 12 may include the subject matter of Example 9, and may further specify that the non-linear conductive pathway comprises one or more of copper, tin, nickel, aluminum, titanium, stainless steel, beryllium, molybdenum, tungsten, silicon carbide, conductive rubber, metal plated elastomer, and tungsten carbide.

Example 13 may include the subject matter of Example 9, and may further specify that the electrical interconnect is a spring-loaded interconnect.

Example 14 may include the subject matter of Example 9, and may further specify that the electrical interconnect is a stamped interconnect.

Example 15 may include the subject matter of Example 9, and may further specify that the electrical interconnect is to propagate an electrical signal that generates electromagnetic fields having an electrical field orthogonal to an electromagnetic field wave propagation direction.

Example 16 may include the subject matter of Example 9, and may further specify that the electrical interconnect further includes: a linear conductive pathway, wherein the linear conductive pathway is in a first portion of the conductive pathway, and wherein the non-linear conductive pathway is in a second portion of the conductive pathway.

Example 17 may include the subject matter of Example 9, and may further specify that the electrical interconnect is a first electrical interconnect, and further including: a second electrical interconnect, including: a second top conductive element; a second bottom conductive element; and a second conductive pathway electrically coupling the second top and second bottom elements, wherein the second conductive pathway is a linear conductive pathway.

Example 18 may include the subject matter of Example 17, and may further specify that the second electrical interconnect is to propagate an electrical signal that generates electromagnetic fields having a magnetic field orthogonal to an electromagnetic field wave propagation direction.

Example 19 may include the subject matter of Example 17, and may further specify that the first electrical interconnect propagates an electrical signal that generates electromagnetic fields in a first direction, wherein the second electrical interconnect propagates an electrical signal that generates electromagnetic fields in a second direction, and wherein the second direction is orthogonal to the first direction.

Example 20 may include the subject matter of Example 17, and may further specify that the first electrical interconnect is adjacent the second electrical interconnect.

Example 21 may include the subject matter of Example 17, and may further specify that the connector includes conductive contacts for electrically coupling an integrated circuit (IC) device to a test board.

Example 22 may include the subject matter of Example 17, and may further specify that the connector is a board to board connector.

Example 23 may include the subject matter of Example 17, and may further specify that the connector includes conductive contacts for electrically coupling an integrated circuit (IC) device having a pin grid array.

Example 24 may include the subject matter of Example 17, and may further specify that the connector includes conductive contacts for electrically coupling an integrated circuit (IC) device having a hybrid pin grid array and land grid array.

Example 25 may include the subject matter of Example 17, and may further specify that the first electrical interconnect and the second electrical interconnect are part of an array of interconnects, and wherein the array of interconnects are arranged with the first electrical interconnect alternating with the second electrical interconnect.

Example 26 is a connector, including: a body; and a first electrical interconnect extending into the body having a first structure; and a second electrical interconnect extending into the body having a second structure, wherein the second structure is different from the first structure.

Example 27 may include the subject matter of Example 26, and may further specify that the first structure is a spring-loaded structure, and wherein the second structure is not a spring-loaded structure.

Example 28 may include the subject matter of Example 26, and may further specify that the first structure is a stamped structure, and that the second structure is not a stamped structure.

Example 29 may include the subject matter of Example 26, and may further specify that the first structure is an elastomer structure, and wherein the second structure is not an elastomer structure.

Example 30 may include the subject matter of Example 26, and may further specify that the first structure is a wired structure, and wherein the second structure is not a wired structure.

Example 31 may include the subject matter of Example 26, and may further specify that the first structure is a buckled structure, and wherein the second structure is not a buckled structure.

Example 32 is a computing device, including: a connector, including: a body; and an electrical interconnect extending into the body, including: a top conductive element; a bottom conductive element; and a conductive pathway electrically coupling the top and bottom elements, wherein the conductive pathway is a non-linear conductive pathway; a first circuit board electrically coupled to the connector; and a second circuit board electrically coupled to the connector, and a conductive signal pathway between the first circuit board and the second circuit board via the connector.

Example 33 may include the subject matter of Example 32, and may further specify that the non-linear conductive pathway is helical.

Example 34 may include the subject matter of Example 32, and may further specify that the non-linear conductive pathway is sinusoidal.

Example 35 may include the subject matter of any of Examples 32-34, and may further specify that the non-linear conductive pathway comprises one or more of copper, tin, nickel, aluminum, titanium, stainless steel, beryllium, molybdenum, tungsten, silicon carbide, conductive rubber, metal plated elastomer, and tungsten carbide.

Example 36 may include the subject matter of any of Examples 32-35, and may further specify that the electrical interconnect is a spring-loaded interconnect.

Example 37 may include the subject matter of any of Examples 32-35, and may further specify that the electrical interconnect is a stamped interconnect.

Example 38 may include the subject matter of any of Examples 32-37, and may further specify that the conductive signal pathway between the first and second circuit boards propagates an electrical signal such that the electrical signal has electromagnetic fields whose electrical field is orthogonal to an electromagnetic field wave propagation direction.

The invention claimed is:

1. An electrical interconnect, comprising:
a top conductive element;
a bottom conductive element; and
a conductive pathway electrically coupling the top and bottom elements, wherein the conductive pathway includes a non-linear conductive pathway; and
wherein the electrical interconnect is to propagate an electrical signal such that the electrical signal has electromagnetic fields whose electrical field is orthogonal to an electromagnetic field wave propagation direction.

2. The electrical interconnect of claim 1, wherein the non-linear conductive pathway is helical.

3. The electrical interconnect of claim 1, wherein the non-linear conductive pathway is sinusoidal.

4. The electrical interconnect of claim 1, wherein the electrical interconnect is a spring-loaded interconnect.

5. The electrical interconnect of claim 1, wherein the electrical interconnect is a stamped interconnect.

6. The electrical interconnect of claim 1, wherein the conductive pathway further comprises:
a linear conductive pathway, wherein the linear conductive pathway is in a first portion of the conductive pathway, and wherein the non-linear conductive pathway is in a second portion of the conductive pathway.

7. A connector, comprising:
a body; and
an electrical interconnect extending into the body, comprising:
a top conductive element;
a bottom conductive element; and
a conductive pathway electrically coupling the top and bottom elements, wherein the conductive pathway is a non-linear conductive pathway; and
wherein the electrical interconnect is to propagate an electrical signal that generates electromagnetic fields having an electrical field orthogonal to an electromagnetic field wave propagation direction.

8. The connector of claim 7, wherein the non-linear conductive pathway is helical.

9. The connector of claim 7, wherein the non-linear conductive pathway is sinusoidal.

10. The connector of claim 7, wherein the electrical interconnect further comprises:
a linear conductive pathway, wherein the linear conductive pathway is in a first portion of the conductive pathway, and wherein the non-linear conductive pathway is in a second portion of the conductive pathway.

11. The connector of claim 7, wherein the electrical interconnect is a first electrical interconnect, and further comprising:
a second electrical interconnect, comprising:
a second top conductive element;

a second bottom conductive element; and a second conductive pathway electrically coupling the second top and second bottom elements, wherein the second conductive pathway is a linear conductive pathway.

12. The connector of claim 11, wherein the second electrical interconnect is to propagate an electrical signal that generates electromagnetic fields having a magnetic field orthogonal to an electromagnetic field wave propagation direction.

13. The connector of claim 11, wherein the first electrical interconnect propagates an electrical signal that generates electromagnetic fields in a first direction, wherein the second electrical interconnect propagates an electrical signal that generates electromagnetic fields in a second direction, and wherein the second direction is orthogonal to the first direction.

14. The connector of claim 11, wherein the first electrical interconnect is adjacent the second electrical interconnect.

15. The connector of claim 11, wherein the connector is a board to board connector.

16. The connector of claim 11, wherein the first electrical interconnect and the second electrical interconnect are part of an array of interconnects, and wherein the array of interconnects are arranged with the first electrical interconnects alternating with the second electrical interconnects.

17. A computing device, comprising:
a connector, comprising:
a body; and
an electrical interconnect extending into the body, comprising:
a top conductive element;
a bottom conductive element; and
a conductive pathway electrically coupling the top and bottom elements, wherein the conductive pathway is a non-linear conductive pathway;
a first circuit board electrically coupled to the connector; and
a second circuit board electrically coupled to the connector, and
a conductive signal pathway between the first circuit board and the second circuit board via the connector, wherein the conductive signal pathway between the first and second circuit boards propagates an electrical signal such that the electrical signal has electromagnetic fields whose electrical field is orthogonal to an electromagnetic field wave propagation direction.

18. The computing device of claim 17, wherein the non-linear conductive pathway is helical.

19. The computing device of claim 17, wherein the non-linear conductive pathway is sinusoidal.

* * * * *